US010955456B2

(12) United States Patent
Becher et al.

(10) Patent No.: US 10,955,456 B2
(45) Date of Patent: Mar. 23, 2021

(54) METHOD AND APPARATUS FOR AUTOMATIC LOCALIZATION OF A FAULT

(71) Applicant: Siemens Aktiengesellschaft, München (DE)

(72) Inventors: Silvio Becher, Munich (DE); Felix Buggenthin, Munich (DE); Klaus Böhme, Berlin (DE); Florian Büttner, Munich (DE); Matthias Kereit, Berlin (DE); Igor Kogan, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 142 days.

(21) Appl. No.: 16/139,669

(22) Filed: Sep. 24, 2018

(65) Prior Publication Data
US 2019/0094286 A1    Mar. 28, 2019

(30) Foreign Application Priority Data
Sep. 26, 2017   (EP) .................................... 17193136

(51) Int. Cl.
*G01R 31/02*   (2006.01)
*G01R 31/08*   (2020.01)
(Continued)

(52) U.S. Cl.
CPC .......... *G01R 31/086* (2013.01); *G01R 11/25* (2013.01); *G01R 31/085* (2013.01);
(Continued)

(58) Field of Classification Search
USPC .................................................. 324/512, 522
See application file for complete search history.

(56) References Cited

U.S. PATENT DOCUMENTS

| 6,256,592 | B1* | 7/2001 | Roberts | ................ | G01R 31/088 |
| | | | | | 324/512 |
| 2004/0243328 | A1* | 12/2004 | Rapp | .................. | G06K 9/00496 |
| | | | | | 702/71 |

FOREIGN PATENT DOCUMENTS

| CN | 101975910 A | 2/2011 |
| CN | 101975910 B | 7/2012 |

(Continued)

OTHER PUBLICATIONS

Thomas Dalstein et al: "Multi Neural Network Based Fault Are Estimation for High Speed Protective Relaying", IEEE Transactions on Power Delivery, IEEE Service Center, New York, NY, US, vol. 11, No. 2, pp. 740-747, XP011049091, ISSN: 0885-8977, DOI: 10.1109/61.489330; the whole document; 1996.

(Continued)

*Primary Examiner* — Vincent Q Nguyen
(74) *Attorney, Agent, or Firm* — Schmeiser, Olsen & Watts LLP

(57) ABSTRACT

Provided is an in-field apparatus and method for automatic localization of a fault having occurred at power transmission lines of a power supply system, the in-field apparatus includes a preprocessing unit configured to process measured voltage and/or current raw time series data of the power transmission lines to provide a normalized raw data and/or feature representation of the measured raw time series data, and an artificial intelligence module configured to predict an optimal evaluation time used for evaluation of the measured voltage and/or current raw time series data to localize the fault based on the normalized raw data and/or feature representation.

17 Claims, 2 Drawing Sheets

(51) Int. Cl.
*G06N 3/08* (2006.01)
*G06N 3/04* (2006.01)
*G06N 20/00* (2019.01)
*G01R 11/25* (2006.01)
*G06N 20/20* (2019.01)
*H02H 1/00* (2006.01)
*G06N 5/00* (2006.01)
*G06N 20/10* (2019.01)

(52) U.S. Cl.
CPC ......... *G01R 31/088* (2013.01); *G06N 3/0445* (2013.01); *G06N 3/0454* (2013.01); *G06N 3/08* (2013.01); *G06N 20/00* (2019.01); *G06N 5/003* (2013.01); *G06N 20/10* (2019.01); *G06N 20/20* (2019.01); *H02H 1/0092* (2013.01)

(56) References Cited

FOREIGN PATENT DOCUMENTS

| CN | 103852692 A | 6/2014 |
|---|---|---|
| DE | 4433406 C1 | 12/1995 |

OTHER PUBLICATIONS

Homci Marcia et al: "A New Strategy Based on Feature Selection for Fault Classification in Transmission Lines", ECCV 2016 Conference; [Lecture Notes in Computer Science; Lect.Notes Computer], Springer International Publishing, Cham, pp. 376-387, XP047359355, ISSN: 0302-9743; ISBN: 978-3-642-33485-6; [retrieved on Oct. 14, 2016] Section 3-5; 2016.

Santos Ricardo C et al: "A novel and comprehensive single terminal ANN based decision support for relaying of VSC based HVDC Iinks", Electric Power Systems Research, Elsevier, Amsterdam, NL, vol. 141, pp. 333-343, XP029755530, ISSN: 0378-7796, DOI: 10.1016/J.EPSR.2016.08.003; * p. 2, col. 2, line 3-p. 6, col. 1, line 21; figures 1,2,3,5 *; 2016.

Extended European Search Report dated Mar. 13, 2018 for Application No. 17193136.3.

Homci März̈ia et al: "A New Strategy Based on Feature Selection for Fault Classification in Transmission Lines", ECCV 2016 Conference; [Lecture Notes in Computer Science; Lect.Notes Computer], Springer International Publishing, Cham, pp. 376-387, XP047359355, ISSN: 0302-9743; ISBN: 978-3-642-33485-6; [retrieved on Dec. 14, 2016] Section 3-5; 2016.

* cited by examiner

METHOD AND APPARATUS FOR AUTOMATIC LOCALIZATION OF A FAULT

CROSS-REFERENCE TO RELATED APPLICATIONS

This application claims priority to European application No. 17193136.3 having a filing date of Sep. 26, 2017 the entire contents both of which are hereby incorporated by reference.

FIELD OF TECHNOLOGY

The following relates to a method and an in-field apparatus for automatic localization of a fault having occurred at power transmission lines of a power supply system.

BACKGROUND

A power supply system of a power supply grid can comprise several power transmission lines to transport electric currents between nodes of a power supply system. Most power supply systems comprise 3-phased transmission lines L1, L2, L3. During the distribution of electrical power via the 3-phased power transmission lines of the power supply grid unexpected failures can occur due to various causes. For example, one or more electrical loops formed by the power transmission lines can comprise a short circuit caused by a falling tree or branch during a storm. This event might cause a short circuit between at least two power transmission lines or between two power transmission lines and earth. Further, a power transmission line might be interrupted by a falling tree or other events. Such failures impact a reliable and safe operation of the power supply system. Accordingly, it is necessary to detect these kind of failures or faults by protective devices within the power supply system. Further, measures have to be taken in the power supply system to prevent a propagation of faults within the remaining power supply grid.

In a conventional power supply system protective devices are normally installed at both ends of power transmission lines connecting two nodes of the power supply system. This protective device can constantly monitor an electric current voltage of every loop formed by the power transmission lines. In case a fault does occur, the normal power supply signal forming a phased sine wave is disturbed by the anomaly or fault. In this case the protective device does trigger the generation of a fault record and can shut down the affected power transmission lines. Given the fault record that does contain the raw signals i.e. the current voltage signals of every power transmission line within a predetermined time interval of e.g. 200 ms as the error occurs the protective device can execute a series of steps to determine the fault location for instance by performing impedance calculations based on the parameters optimal measurement point and optimal window size. The accuracy of the calculated fault location does strongly depend on the choice of these two parameters that are in turn determined based on the raw signals.

SUMMARY

An aspect relates to a method and an apparatus for automatic localization of a fault having occurred at power transmission lines of a power supply system which is robust and provides an accurate localization of the fault.

The following provides according to a first aspect an in-field apparatus for automatic localization of a fault having occurred at power transmission lines of a power supply system, said in-field apparatus comprising:
a preprocessing unit adapted to process measured voltage and/or current raw time series data of the power transmission lines to provide a normalized raw data and/or feature representation of the measured raw time series data; and
an artificial intelligence module configured to predict an optimal evaluation time used for evaluation of the measured voltage and/or current raw time series data to localize the fault based on the normalized raw data and/or feature representation.

In a possible embodiment of the in-field apparatus according to the first aspect of embodiments of the present invention the preprocessing unit is adapted to perform a z-score normalization of measured voltage and/or current raw data of the power transmission lines.

In a still further possible embodiment of the in-field apparatus according to the first aspect of embodiments of the present invention the artificial intelligence module comprises a window detection unit adapted to determine an optimal window size of a window used for feature extraction from the measured voltage and/or current raw time series data.

In a still further possible embodiment of the in-field apparatus according to the first aspect of embodiments of the present invention the artificial intelligence module further comprises a time point detection unit adapted to determine an optimal evaluation time point for the evaluation of features extracted from the measured voltage and/or current raw time series data.

In a further possible embodiment of the in-field apparatus according to the first aspect of embodiments of the present invention the window detection unit is adapted to generate learned regression curves for different predefined window sizes.

In a further possible embodiment of the in-field apparatus according to the first aspect of embodiments of the present invention the artificial intelligence module comprises a false positive detection unit adapted to determine a probability whether the predicted optimal evaluation time does lead to a valid fault localization.

In a still further possible embodiment of the in-field apparatus according to the first aspect of embodiments of the present invention the artificial intelligence module is adapted to perform a feature-based fault classification based on the feature representation of the preprocessed measured raw time series data provided by the preprocessing unit.

In a still further possible embodiment of the in-field apparatus according to the first aspect of embodiments of the present invention the artificial intelligence module is configured to perform the feature-based fault classification using a random forest, a decision tree, a support vector machine, and/or a fully connected neural network.

In a still further possible embodiment of the in-field apparatus according to the first aspect of embodiments of the present invention the artificial intelligence module is adapted to perform a not feature-based direct fault classification based on the normalized measured raw time series data provided by the preprocessing unit.

In a further possible embodiment of the in-field apparatus according to the first aspect of embodiments of the present invention the artificial intelligence module is configured to perform the not feature-based direct fault classification using a feed-forward neural network, in particular a convolutional neural network or a recurrent neural network.

In a further possible embodiment of the in-field apparatus according to the first aspect of embodiments of the present invention the preprocessing unit is adapted to normalize raw data of a measured fault record.

In a still further possible embodiment of the in-field apparatus according to the first aspect of embodiments of the present invention the measured fault record applied to the preprocessing unit comprises voltage raw data of different voltage phases transported through corresponding power transmission lines, current raw data of associated electrical currents transported through the respective power transmission lines, and current raw data of an electrical current flowing through earth.

In a further possible embodiment of the in-field apparatus according to the first aspect of embodiments of the present invention the voltage and/or current raw data of the measured fault record processed by said preprocessing unit comprises data samples measured by corresponding sensors within a time window.

In a still further possible embodiment of the in-field apparatus according to the first aspect of embodiments of the present invention a database or an online stream of fault records with known fault types is provided and used to train the artificial intelligence module of the in-field detection apparatus.

In a still further possible embodiment of the in-field apparatus according to the first aspect of embodiments of the present invention the database of fault records comprises simulated fault records and/or fault records of historical faults having occurred at power transmission lines of the power supply system.

In a still further possible embodiment of the in-field apparatus according to the first aspect of embodiments of the present invention countermeasures to remove a fault are initiated automatically by a controller depending on a detected fault type of the localized fault.

The following further provides according to a second aspect a method for automatic localization of a fault comprising the features of claim 15.

The following provides according to the second aspect a method for automatic localization of a fault having occurred at power transmission lines of a power supply system, the method comprising the steps of:
preprocessing measured voltage and/or current raw time series data of the power transmission lines to provide a normalized raw data and/or feature representation of the raw time series data, calculating an optimal evaluation time point and/or evaluation time window based on the normalized raw data and/or feature representation using a trained artificial intelligence module and evaluating by the trained artificial intelligence module the measured voltage and/or current raw time series data using the calculated optimal evaluation time point and/or evaluation time window to localize the fault.

BRIEF DESCRIPTION

Some of the embodiments will be described in detail, with references to the following Figures, wherein like designations denote like members, wherein.

DETAILED DESCRIPTION

Figure 1:
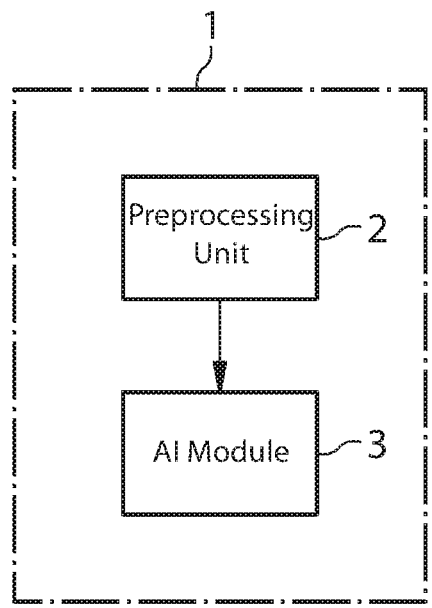
FIG. 1 shows a block diagram of an exemplary embodiment of an in-field apparatus according to the first aspect of the present invention.

As can be seen in the block diagram of FIG. 1 the in-field apparatus 1 according to the first aspect of embodiments of the present invention can be used for automatic localization of a fault having occurred at power transmission lines of a power supply system. The in-field apparatus 1 can be provided at any network node of the power supply system or power supply network. In-field apparatus 1 comprises in the illustrated embodiment a preprocessing unit 2 and an artificial intelligence module 3. The preprocessing unit 2 of the in-field apparatus 1 is adapted to process measured voltage and current raw time series data of power transmission lines to provide a normalized raw data and/or feature representation of the measured raw time series data. In a possible embodiment the preprocessing unit 2 is adapted to perform a z-score normalization of measured voltage and/or current raw data of the power transmission lines.

The in-field apparatus 1 comprises an artificial intelligence module 3. This artificial intelligence module 3 is configured to predict an optimal evaluation time used for evaluation of the measured voltage and/or current raw time series data to localize the fault based on the normalized raw data and/or features representation provided by the preprocessing unit 2. As can be seen in the embodiment illustrated in FIG. 2 the artificial intelligence module 3 can comprise a window detection unit 3A and a time point detection unit 3B. The window detection unit 3A is adapted to determine an optimal window size of a window used for feature extraction from the measured voltage and/or current raw time series data. The time point detection unit 3B is adapted to determine an optimal evaluation time point for the evaluation of features extracted from the measured voltage and/or current raw time series data. The window detection unit 3A can in a possible embodiment be adapted to generate learned regression curves for different predefined window sizes. In the illustrated embodiment of FIG. 2 the artificial intelligence module 3 further comprises a false positive detection unit 3C adapted to determine a probability whether the predicted optimal evaluation time does lead to a valid fault localization.

The artificial intelligence module 3 of the in-field apparatus 1 can be adapted to perform a feature-based fault classification based on the feature representation of the preprocessed measured raw time series data provided by the preprocessing unit 2. In a possible embodiment the artificial intelligence module 3 can be configured to perform the feature-based fault classification using a random forest, a decision tree, a support vector machine and/or a fully connected neural network.

In an alternative embodiment the in-field apparatus 1 comprises an artificial intelligence module 3 which is adapted to perform a not feature-based direct fault classification based on the normalized measured raw time series data provided by the preprocessing unit 2 of the in-field apparatus 1. The artificial intelligence module 3 can be configured to perform the not feature-based direct fault classification using in a possible embodiment a feed-forward neural network, in particular a convolutional neural network CNN or a recurrent neural network RNN.

Figure 2:
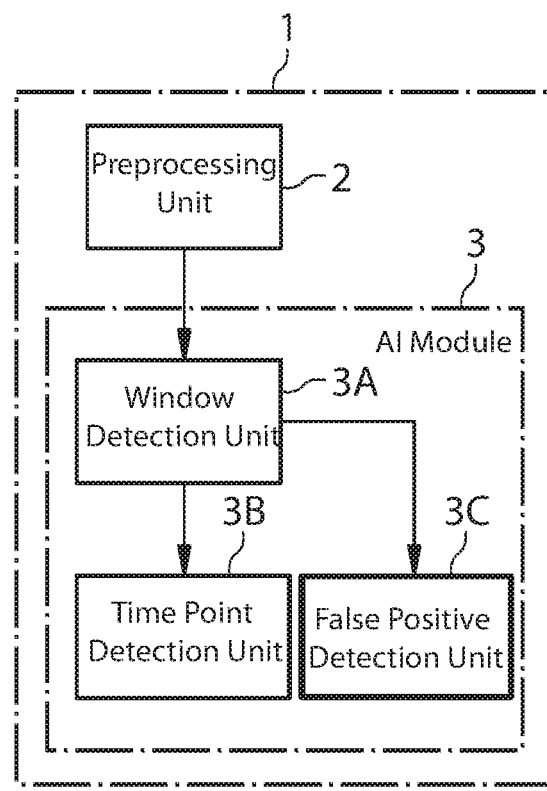
FIG. 2 shows a block diagram of a further exemplary embodiment of an in-field apparatus according to the first aspect of the present invention.

In the embodiment illustrated in FIGS. 1, 2 the preprocessing unit 2 can be used to normalize the raw data of a measured fault record. This fault record can in a possible embodiment comprise voltage raw data of different voltage phases transported through corresponding power transmission lines of the power supply system. The fault record can further comprise current raw data of associated electrical currents transported through the respective power transmission lines L1, L2, L3 of the power supply system. In a further embodiment the measured forward record further can comprise current raw data of an electrical current flowing through earth potential E. Voltage and/or current raw data of the measured fault record applied to the preprocessing unit 2 of the in-field detection apparatus 1 are processed by the preprocessing unit 2 in real time. The fault record can comprise data samples measured by corresponding sensors within a predefined time window.

A database or online stream of fault records with known fault types can be used to train the artificial intelligence module 3 of the in-field detection apparatus 1 as illustrated in the embodiments of FIGS. 1, 2. The database of fault records can comprise simulated fault records and/or fault records of historical faults having occurred at power transmission lines of the power supply system. In a possible embodiment the in-field detection apparatus 1 can further comprise a controller connected to the artificial intelligence module 3. In a possible embodiment, countermeasures to remove a fault are initiated automatically by the controller of the in-field detection apparatus 1 depending on a detected fault type of the localized fault.

The in-field apparatus 1 according to embodiments of the present invention comprises the artificial intelligence module 3 which allows to automatically determine specific parameters, in particular an optimal evaluation time which can be used for evaluation of the measured voltage and/or current raw time series data. The parameters can comprise an optimal window size of a window used for feature extraction from the measured voltage and/or current raw time series data. Further, the parameters can comprise an optimal evaluation time point for the evaluation of features extracted from the measured voltage and/or current raw time series data. The artificial intelligence module 3 can execute an artificial neural network ANN stored in a local memory of the in-field apparatus 1. The memory footprint of the artificial neural network stored in the local memory is comparatively low (i.e. the memory space required by the artificial intelligence module 3 is low). In a possible embodiment the in-field apparatus 1 according to the first aspect of embodiments of the present invention can be implemented on a SIPROTEC device of a power supply system.

Figure 3:
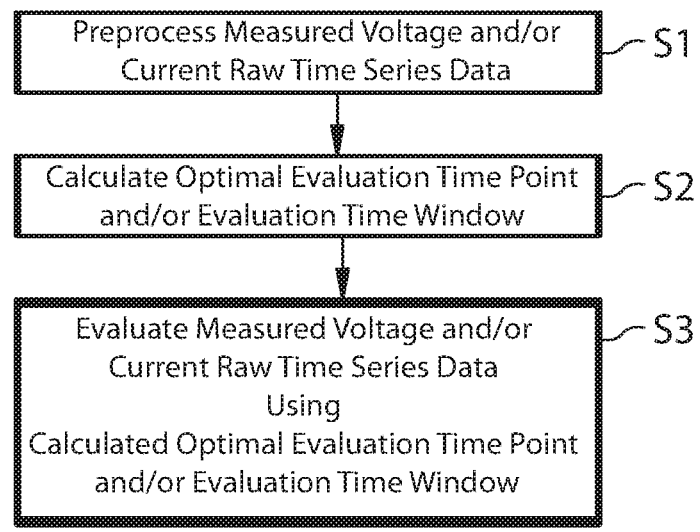
FIG. 3 shows a flowchart of an exemplary embodiment of a method for automatic localization of a fault according to a second aspect of the present invention.

FIG. 3 shows a flowchart of a possible exemplary embodiment of a method of automatic localization of a fault having occurred in the power transmission lines of a power supply system.

In the illustrated embodiment the method comprises three main steps S1, S2, S3.

In a first step S1 measures voltage and/or current raw time series data of the power transmission lines are preprocessed to provide a normalized raw data and/or feature representation of the raw time series data. This preprocessing can comprise a Z-score normalization of the measured voltage and/or current raw data of the power transmission lines.

In a further step S2 an optimal evaluation time point and/or evaluation time window is calculated based on the normalized raw data and/or feature representation using a trained artificial intelligence module.

In a third step S3 the trained artificial intelligence module is evaluating the measured voltage and/or current raw time series data using the calculated optimal evaluation time point and/or evaluation time window to localize the fault.

In a preferred embodiment the steps S1, S2, S3 of the method as illustrated in FIG. 3 are performed in real time.

The method and apparatus according to embodiments of the present invention requires very limited hardware resources, in particular storage resources and/or calculation resources. The method according to embodiments of the present invention leads to an improved prediction of fault localization estimations compared to a conventional expert-driven rule-based prediction system. In a preferred embodiment the in-field apparatus 1 even provides information whether a fault record is valid or invalid. It can automatically recognize whether it is able to make a reliable prediction of a fault localization given a specific error report. The artificial intelligence module 3 can be trained on a combination of synthetic fault records which can be generated efficiently by existing simulation systems. Further, the artificial intelligence module 3 can also be trained with historical fault records of faults having occurred in the past. The artificial intelligence module 3 is trained and can learn to interpret data patterns in data which can in turn be used to process new previously unseen data samples. The in-field apparatus 1 according to embodiments of the present invention does not use a rule-based module that requires an extensive manual effort to be extended. The in-field apparatus 1 comprises an artificial intelligence module 3 which can be automatically extending its knowledge about faults by training on a growing set of real or simulated fault records. In a preferred embodiment the artificial intelligence module 3 executes an artificial neural network ANN stored in a local memory of the in-field apparatus 1. This artificial neural network ANN can comprise an artificial deep neural network. The artificial deep neural network can take as an input numerical values, e.g. raw or preprocessed electrical currents and/or electrical voltages of the different power line loops of the power supply system. This data can be passed through a network of weighted non-linear functions and results in several output values. In order to obtain an optimal measurement point, first a continuous output is learnt that can correspond to the deviation between the impedance value that would be computed given a certain measurement point and the true value. This normalized impedance value can be generated for various window sizes. In a possible embodiment the artificial intelligence module 3 can generate a binary output or flag indicating whether a fault record is invalid or valid. To obtain a system that can reliably perform automatic calculations of fault locations for unseen data, the artificial neural network ANN can be trained to detect patterns by sequentially passing data samples with a known output value (e.g. a function output for regression, class label for classification) through the artificial neural ANN network and by comparing the generated output value with the expected value.

The preprocessing unit 2 of the in-field apparatus 1 can take as input in a possible embodiment seven raw input values from a fault record and applies a series of preprocessing operations. In general, these preprocessing operations can include a mandatory normalization step (z-score normalization) and an optional step to compute a set of features on the received raw data. The resulting values can then be fed into the artificial intelligence module 3.

The artificial intelligence module 3 comprises in a possible embodiment as illustrated in FIG. 2 a window detection unit 3A and a time point detection unit 3B. The window detection unit 3A can take as an input the preprocessed fault record values and can feed this input into an artificial neural network ANN which generates a (learned) regression curve for every defined window size. The artificial neural network ANN can predict a deviation between a true impedance value and the one that would be computed given the raw inputs for every time point. This value can also be referred to as normalized impedance.

The time point detection unit 3B takes as an input the predicted normalized impedance values for all measurements points for a single fault record. In a possible embodiment for every window size a moving mean value is applied to smooth the resulting regression curve. Afterwards the optimal window size and measurement point can be identified by minimizing the smoothed normalized impedance values across the window sizes and measurement points.

In a possible embodiment the artificial intelligence module 3 can further comprise a false positive detection module 3C. This false positive detection module 3C can take as input all predicted and smoothed impedance values. The false positive detection module can output a score in the range of [0,1], i.e. a class probability whether the predicted optimal measurement window will lead to a valid fault location computation or not.

The in-field apparatus 1 according to embodiments of the present invention can be embedded in an in-field protection device such as SIPROTEC having limited computational and storage resources.

The artificial intelligence module 3 of the in-field apparatus 1 comprises an artificial neural network ANN which can be trained in a training procedure. In a possible embodiment first a database (or online stream) of fault records with known fault locations can be generated by a simulation algorithm. The capabilities of the model depend on the number and variation of fault records used for training the artificial neural network of the artificial intelligence module 3. Further, the performance of the artificial intelligence module 3 can be increased by adding as many real fault records to the dataset as possible. Second, impedances can be computed for a number of defined window sizes and can be normalized by known fault location. The normalized impedance can serve as an output. Lastly, the dataset can be split into a training and in a validation dataset. The artificial intelligence module 3 can then be optimized on the training dataset and then tested on the validation dataset which is not used during training. Once the module training of the artificial intelligence module 3 has been completed (i.e. error is minimized) the trained artificial neural network ANN can be saved with a predefined architecture with learned weights.

During inference a new data sample (e.g. a fault record) can be passed through the artificial intelligence module 3, yet without knowing the intended output value. Thus, in a possible embodiment only a forward pass is needed without back-propagating any error.

The system can be parameterized by the window sizes provided by the method and apparatus according to embodiments of the present invention. Normalized impedances can be computed for every window size and can serve as samples for a target function. For every defined window size a single neural network can be trained until a mean logarithmic error of the predicted function samples and the real ones is minimized. Similarly, an artificial neural network can be defined to identify invalid fault records. A goal in this case can be that the resulting fault location of the post-processing module deviates e.g. not more than 5 km from the true value. Optionally the neural networks can be coupled by sharing the weights of the first layers.

In a possible embodiment the method and apparatus according to embodiments of the present invention do not require any feature computation on the raw input signals as the artificial neural network ANN is capable of learning the important or relevant characteristics directly in an end-to-end fashion. A feature-based machine learning approach does require more domain understanding and manual efforts to design good features. This also bears the risk of missing important patterns that cannot be recognized by the pre-defined feature set. The performance relies on the raw input data with a mild normalization step and thus can easily be extended or improved by feeding newly simulated or real fault records.

In a possible embodiment the size of the artificial intelligence module 3 can be significantly reduced by using domain knowledge to process the raw input data, thereby generating features that are known to be beneficial for the task at hand. In this embodiment a moving window (e.g. having a window size of 32) and e.g. seven input time series data (i.e. electrical current and electrical voltage of every transmission loop) can then be used to compute a set of e.g. seven statistical features such as sum, mean value, median value, min value, max value, variance or standard deviation. The statistical features can be used to describe the properties over time. In a possible embodiment it is possible to compute a moving Fourier transform (window size=32) to expose the range of frequencies in the signals. In a possible embodiment instead of using a convolutional neural network CNN, a fully connected neural network can be implemented with a single hidden layer and a relatively small number of hidden nodes (e.g. number of hidden nodes n=50).

In a possible embodiment the method and apparatus according to embodiments of the present invention can also be implemented in a standard computer or PC as part of an analytics framework such as the SIGRA system that allows an offline analysis of fault records and a computation of fault locations.

The method and apparatus according to embodiments of the present invention is data-driven. The method and apparatus have a performance which does improve with more data or received data records. The method and apparatus according to embodiments of the present invention is not rule-based and consequently does require less expert domain knowledge. Improvements of the artificial intelligence module 3 can be provided without adding new rules and thresholds. The artificial intelligence module 3 of the in-field apparatus 1 can be trained both on real and/or simulated fault data. It is not necessary to compute domain-specific features as the features are implicitly learned by the deep neural network implemented in the artificial intelligence module 3. Further, new and improved versions of the artificial intelligence module 3 can be generated autonomously i.e. the neural network of the artificial intelligence module 3 can be retrained on new or additional data without any human interaction.

In a possible embodiment the in-field apparatus 1 according to embodiments of the present invention can be implemented on a SIPROTEC protection device of a power supply system. In a further embodiment the artificial neural network 3 can provide a deep learning neural network which requires a computation time of less than 200 ms. The number of layers and the artificial neural network can vary depending on the use case. The artificial intelligence module 3 allows for more accurate results with a small memory footprint and requires few computational resources. The in-field apparatus 1 according to embodiments of the present invention can be integrated in a protection device such as a digital protection relay of a power supply system. The in-field apparatus 1 can comprise in a possible embodiment a preprocessing unit 2, an artificial intelligence module 3 and a controller. The controller can perform automatically countermeasures depending on a detected fault type of the localized fault. These countermeasures can for instance comprise switching operations performed by switches connected to the controller of the in-field apparatus 1. The calculated fault location can be output to a user via user interface. Further, the calculated fault location can be used for further processing by other entities of the system.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. An in-field apparatus for automatic localization of a fault having occurred at power transmission lines of a power supply system, the in-field apparatus comprising:
   (a) a preprocessing unit configured to process measured voltage and/or current raw time series data of the power transmission lines to provide a normalized raw data and/or feature representation of the measured raw time series data; and
   (b) an artificial intelligence module configured to predict an optimal evaluation time used for evaluation of the measured voltage and/or current raw time series data to localize the fault based on the normalized raw data and/or feature representations;
   wherein the artificial intelligence module comprises:
      a window detection unit configured to determine an optimal window size of a window used for feature extraction from the measured voltage and/or current raw time series data; and
      a time point detection unit configured to determine an optimal evaluation time point for the evaluation of features extracted from the measured voltage and/or current raw time series data.

2. The in-field apparatus according to claim 1, wherein the preprocessing unit is configured to perform a z-score normalization of measured voltage and/or current raw data of the power transmission lines.

3. The in-field apparatus according to claim 1, wherein the window detection unit is configured to generate learned regression curves for different predefined window sizes.

4. The in-field apparatus according to claim 1, wherein the artificial intelligence module comprises:
   a false positive detection unit configured to determine a probability whether the predicted optimal evaluation time does lead to a valid fault localization.

5. The in-field apparatus according to claim 1, wherein the artificial intelligence module is configured to perform a feature-based fault classification based on the feature representation of the preprocessed measured raw time series data provided by said preprocessing unit.

6. The in-field apparatus according to claim 5, wherein the artificial intelligence module is configured to perform the feature-based fault classification using a random forest, a decision tree, a support vector machine, and/or a fully connected neural network.

7. The in-field apparatus according to claim 1, wherein the artificial intelligence module is configured to perform a not feature-based direct fault classification based on the normalized measured raw time series data provided by the preprocessing unit.

8. The in-field apparatus according to claim 7, wherein the artificial intelligence module is configured to perform the not feature-based direct fault classification using a feedforward neural network or a recurrent neural network, RNN.

9. The in-field detection apparatus according to claim 1, wherein the preprocessing unit is configured to normalize raw data of a measured fault record comprising:
   voltage raw data of different voltage phases transported through corresponding power transmission lines,
   current raw data of associated electrical currents transported through the respective power transmission lines, and
   current raw data of an electrical current flowing through earth.

10. The in-field detection apparatus according to claim 9, wherein the voltage and/or current raw data of the measured fault record processed by the preprocessing unit comprises data samples measured by corresponding sensors within a time window.

11. The in-field detection apparatus according to claim 1, wherein a database or an online stream of fault records with known fault types is provided and used to train the artificial intelligence module of the in-field detection apparatus.

12. The in-field detection apparatus according to claim 11, wherein the database of fault records comprises simulated fault records and/or fault records of historical faults having occurred at power transmission lines of said power supply system.

13. The in-field detection apparatus according to claim 1, wherein countermeasures to remove a fault are initiated automatically by a controller depending on a detected fault type of the localized fault.

14. A method for automatic localization of a fault having occurred at power transmission lines of a power supply system, the method comprising the steps of:
   (a) preprocessing measured voltage and/or current raw time series data of the power transmission lines to provide a normalized raw data and/or feature representation of the raw time series data;
   (b) calculating an optimal evaluation time point and/or evaluation time window based on the normalized raw data and/or feature representation using a trained artificial intelligence module;
   (c) evaluating by the trained artificial intelligence module the measured voltage and/or current raw time series data using the calculated optimal evaluation time point and/or evaluation time window to localize the fault; and
   (d) performing by the trained artificial intelligence module a feature-based fault classification based on the feature representation of the preprocessed raw time series data.

15. The method according to claim 14, wherein the feature-based fault classification is performed using a random forest, a decision tree, a support vector machine, and/or a fully connected neural network.

16. An apparatus for automatic localization of a fault in a power supply system, the apparatus comprising:
   (a) a preprocessing unit configured to process measured voltage and/or current raw time series data of the power transmission lines to provide a normalized raw data and/or feature representation of the measured raw time series data; and
   (b) an artificial intelligence module configured to predict an optimal evaluation time used for evaluation of the measured voltage and/or current raw time series data to localize the fault based on the normalized raw data and/or feature representation, wherein the artificial intelligence module is configured to perform a feature-based fault classification based on the feature representation of the preprocessed measured raw time series data provided by said preprocessing unit.

17. The apparatus according to claim 16, wherein the artificial intelligence module is configured to perform the feature-based fault classification using a random forest, a decision tree, a support vector machine, and/or a fully connected neural network.

\* \* \* \* \*